(12) United States Patent
Ting et al.

(10) Patent No.: US 9,236,542 B1
(45) Date of Patent: Jan. 12, 2016

(54) LIGHT EMITTING ELEMENT STRUCTURE

(71) Applicant: Genesis Photonics Inc., Tainan (TW)

(72) Inventors: Shao-Ying Ting, Tainan (TW);
Kuan-Chieh Huang, Tainan (TW);
Jing-En Huang, Tainan (TW); Yi-Ru Huang, Tainan (TW)

(73) Assignee: Genesis Photonics Inc., Shanhua Dist., Tainan (TW)

( * ) Notice: Subject to any disclaimer, the term of this patent is extended or adjusted under 35 U.S.C. 154(b) by 0 days.

(21) Appl. No.: 14/582,207

(22) Filed: Dec. 24, 2014

(30) Foreign Application Priority Data

Sep. 15, 2014 (TW) .............................. 103216333 U

(51) Int. Cl.
*H01L 33/00* (2010.01)
*H01L 33/58* (2010.01)
*H01L 33/50* (2010.01)

(52) U.S. Cl.
CPC .............. *H01L 33/58* (2013.01); *H01L 33/507* (2013.01)

(58) Field of Classification Search
CPC ...... H01L 33/60; H01L 33/20; H01L 22/0079
USPC .................................... 257/98; 438/22, 29, 31
See application file for complete search history.

(56) References Cited

U.S. PATENT DOCUMENTS

| 2004/0223100 | A1* | 11/2004 | Kotchick et al. | ..... G02B 27/142 349/114 |
| 2010/0213488 | A1* | 8/2010 | Choi et al. | .............. H01L 33/44 257/98 |
| 2011/0186813 | A1* | 8/2011 | Kim | ....................... H01L 33/44 257/13 |

* cited by examiner

*Primary Examiner* — Jami M Valentine
(74) *Attorney, Agent, or Firm* — Winston Hsu; Scott Margo

(57) ABSTRACT

A light emitting element structure includes a light emitting unit configured to emit light; a package unit configured to cover the light emitting unit; a transparent light guide structure arranged on the package unit; and a first anti-reflection film arranged on the transparent light guide structure, wherein a thickness of the first anti-reflection film is an odd multiple of $\lambda/4n$, $\lambda$ is a wavelength of light passing through the package unit from the light emitting unit, and n is a refractive index of the first anti-reflection film.

9 Claims, 3 Drawing Sheets

LIGHT EMITTING ELEMENT STRUCTURE

BACKGROUND OF THE INVENTION

1. Field of the Invention

The present invention relates to a light emitting element structure, and more particularly, to a light emitting element structure capable of increasing light extraction efficiency and light divergence angle.

2. Description of the Prior Art

Since light emitting diodes (LEDs) have advantages of long service life, small size and low power consumption, the light emitting diodes are widely used in various kinds of illumination devices and display devices. Generally, a light emitting diode structure usually comprises a light emitting unit and a package unit. The light emitting unit is a light emitting diode die for emitting light. The package unit covers the light emitting unit, and may comprise wavelength conversion particles for converting a wavelength of light emitted from the light emitting unit.

However, in the light emitting diode structure of the prior art, a difference between a refractive index of the package unit and a refractive index of air is large, such that partial light emitted from the light emitting unit is totally reflected by an interface between the package unit and air. Therefore, the light emitting diode structure of the prior art has lower light extraction efficiency. Moreover, the light emitting diode structure of the prior art also has a smaller light divergence angle, so as to decrease illumination efficiency of the light emitting diode structure.

SUMMARY OF THE INVENTION

An objective of the present invention is to provide a light emitting element structure capable of increasing light extraction efficiency and light divergence angle, in order to solve problems of the prior art.

A light emitting element structure of the present invention comprises a light emitting unit configured to emit light; a package unit configured to cover the light emitting unit; a transparent light guide structure arranged on the package unit; and a first anti-reflection film arranged on the transparent light guide structure, wherein a thickness of the first anti-reflection film is an odd multiple of $\lambda/4n$, $\lambda$ is a wavelength of light passing through the package unit from the light emitting unit, and n is a refractive index of the first anti-reflection film.

In an embodiment of the present invention, the package unit comprises a package resin, and a plurality of wavelength conversion particles distributed in the package resin, for converting a wavelength of light emitted from the light emitting unit.

In an embodiment of the present invention, the plurality of wavelength conversion particles are fluorescent powders.

In an embodiment of the present invention, the plurality of wavelength conversion particles are quantum dots.

In an embodiment of the present invention, the refractive index of the first anti-reflection film is between a refractive index of the transparent light guide structure and a refractive index of air.

In an embodiment of the present invention, the first anti-reflection film is made of magnesium fluoride.

In an embodiment of the present invention, the package structure further comprises a second anti-reflection film, arranged between the transparent light guide structure and the package unit, wherein a thickness of the second anti-reflection film is an odd multiple of $\lambda/4m$, m is a refractive index of the second anti-reflection film.

In an embodiment of the present invention, the refractive index of the second anti-reflection film is between a refractive index of the transparent light guide structure and a refractive index of the package unit.

In an embodiment of the present invention, the light emitting unit is a light emitting diode die.

In contrast to the prior art, the light emitting element structure of the present invention utilizes the transparent light guide structure and the anti-reflection film to reduce occurrence of total internal reflection for light emitted from the light emitting unit, so as to increase light extraction efficiency of the light emitting element structure. Moreover, the transparent light guide structure of the light emitting element structure of the present invention can increase the light divergence angle of the light emitting element structure, in order to further improve illumination efficiency of the light emitting element structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
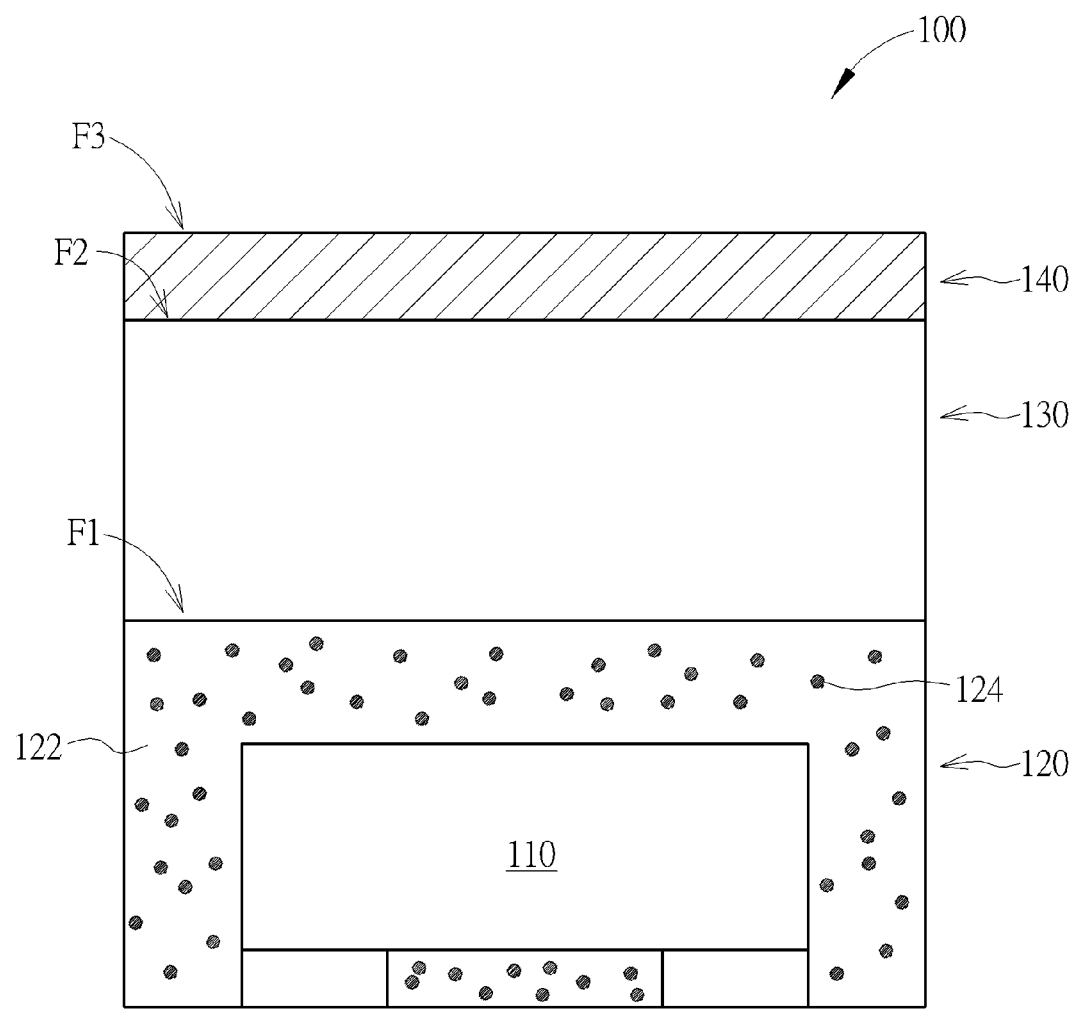
FIG. 1 is a diagram showing a light emitting element structure according to a first embodiment of the present invention.

Please refer to FIG. 1. FIG. 1 is a diagram showing a light emitting element structure according to a first embodiment of the present invention. As shown in FIG. 1, the light emitting element structure 100 of the present invention comprises a light emitting unit 110, a package unit 120, a transparent light guide structure 130 and a first anti-reflection film 140. The light emitting unit 110 is configured to emit light. In the embodiment of the present invention, the light emitting unit 110 is a light emitting diode die, but the present invention is not limited to it. The package unit 120 is configured to cover the light emitting unit 110, for providing protection. The transparent light guide structure 130 is arranged on the package unit 120. Generally, the transparent light guide structure 130 can be made of glass, silicon or other proper material, and a refractive index of the transparent light guide structure 130 is around 1.5, which is between a refractive index of the package unit (around 1.6) and a refractive index of air (around 1). Since the refractive index of the transparent light guide structure 130 is close to the refractive index of the package unit 120, when the light emitted from the light emitting unit 110 arrives at the transparent light guide structure 130 through the package unit 120, possibility of light being totally reflected by an interface F1 between the transparent light guide structure 130 and the package unit 120 is smaller, such that light extraction efficiency of the light emitting element structure 100 is increased. Moreover, the transparent light guide structure 130 can further increase a light divergence angle of the light emitting element structure 100.

The first anti-reflection film 140 is arranged on the transparent light guide structure 130, and a refractive index of the first anti-reflection film 140 is between the refractive index of the transparent light guide structure 130 and a refractive index of air, that is to say, the refractive index of the first anti-reflection film 140 is between 1 and 1.5. For example, the first anti-reflection film 140 can be made of magnesium fluoride. Since the refractive index of the first anti-reflection film 140 is between the refractive index of the transparent light guide structure 130 and the refractive index of air, the refractive index is gradually changed when the light arriving at the air through the transparent light guide structure 130 and the first anti-reflection film 140. Therefore, when the light emitted from the light emitting unit 110 arrives at the first anti-reflection film 140 through the transparent light guide structure 130, possibility of light being totally reflected by an interface F2 between the first anti-reflection film 140 and the transparent light guide structure 130 is smaller. Similarly, when the light emitted from the light emitting unit 110 arrives at the air through the first anti-reflection film 140, possibility of light being totally reflected by an interface F3 between the air and the first anti-reflection film 140 is smaller. Therefore, the first anti-reflection film 140 can further increase the light extraction efficiency of the light emitting element structure 100.

Figure 2:
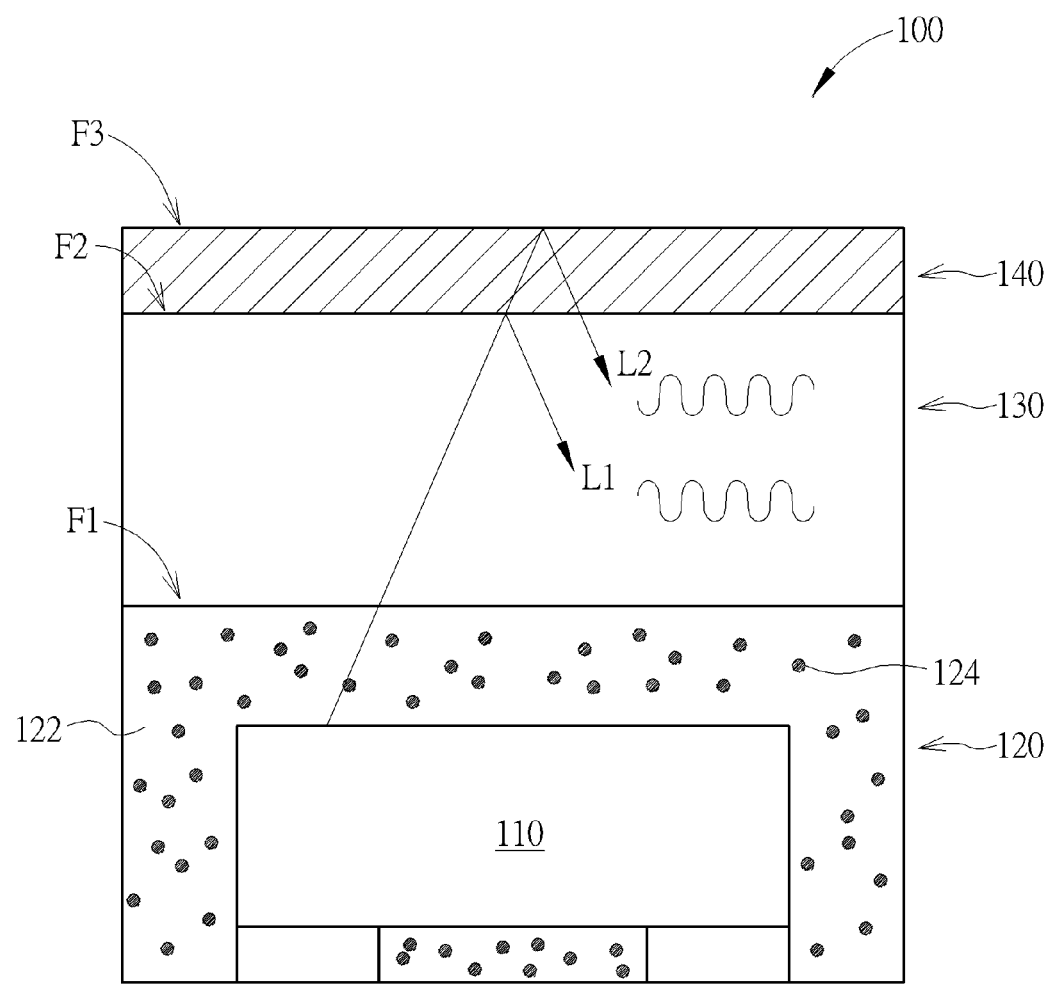
FIG. 2 is a diagram showing the light emitting element structure of the present invention reducing occurrence of light reflection.

On the other hand, a thickness of the first anti-reflection film 140 is an odd multiple of $\lambda/4n$, where $\lambda$ is a wavelength of light passing through the package unit 120 from the light emitting unit 110, and n is the refractive index of the first anti-reflection film 140. Thus occurrence of total internal reflection of light can be further reduced. For example, please refer to FIG. 2. FIG. 2 is a diagram showing the light emitting element structure of the present invention reducing occurrence of light reflection. As shown in FIG. 2, when partial light L1 emitted from the light emitting unit 110 is totally reflected by the interface F2 between the first anti-reflection film 140 and the transparent light guide structure 130, and partial light L2 emitted from the light emitting unit 110 is totally reflected by the interface F3 between the air and the first anti-reflection film 140, the light L1 reflected by the interface F2 between the first anti-reflection film 140 and the transparent light guide structure 130 has a phase opposite to a phase of the light L2 reflected by the interface F3 between the air and the first anti-reflection film 140, such that the light L1 reflected by the interface F2 between the first anti-reflection film 140 and the transparent light guide structure 130 and the light L2 reflected by the interface F3 between the air and the first anti-reflection film 140 are mutually canceled, so as to further reduce occurrence of total internal reflection in the light emitting element structure 100.

In addition, in the above embodiment, the package unit 120 comprises a package resin 122 and a plurality of wavelength conversion particles 124 distributed in the package resin 122. The plurality of wavelength conversion particles 124 are configured to convert a wavelength of the light emitted from the light emitting unit 110. For example, the plurality of wavelength conversion particles 124 can be fluorescent powders or quantum dots, and the plurality of wavelength conversion particles 124 can convert the wavelength of the light emitted from the light emitting unit 110 to a predetermined wavelength according to design requirements. However, in other embodiments of the present invention, the package unit 120 may not comprise the wavelength conversion particles 124, the package unit 120 can only comprise the package resin 122 for protecting the light emitting unit 110, such that a wavelength of light emitted from the light emitting element structure 100 is identical to the wavelength of light emitted from the light emitting unit 110.

Figure 3:
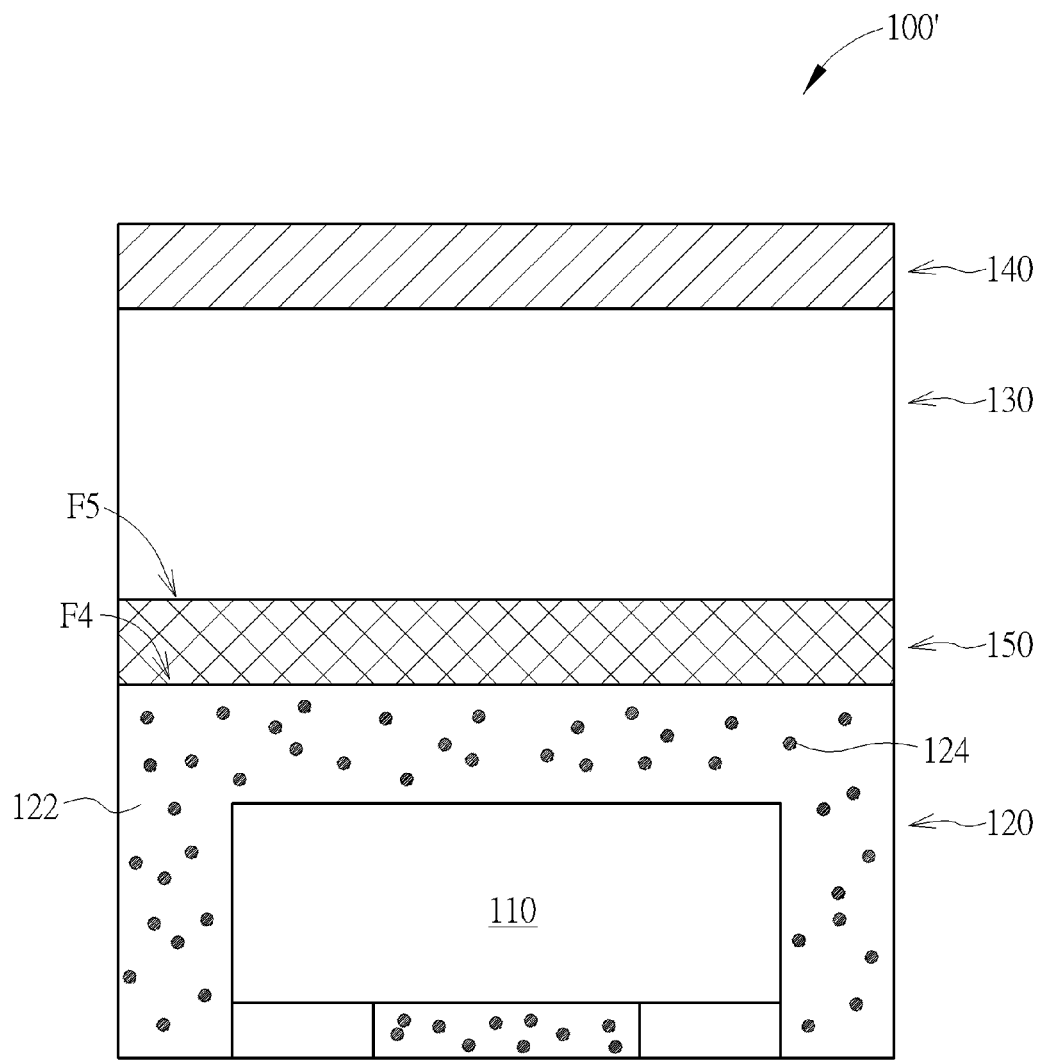
FIG. 3 is a diagram showing a light emitting element structure according to a second embodiment of the present invention.

Please refer to FIG. 3. FIG. 3 is a diagram showing a light emitting element structure according to a second embodiment of the present invention. As shown in FIG. 3, apart from the light emitting unit 110, the package unit 120, the transparent light guide structure 130 and the first anti-reflection film 140, the light emitting element structure 100' of the present invention further comprises a second anti-reflection film 150, arranged between the transparent light guide structure 130 and the package unit 120. Moreover, a refractive index of the second anti-reflection film 150 is between the refractive index of the transparent light guide structure 130 and the refractive index of the package unit 120, that is to say, the refractive index of the second anti-reflection film 150 is between 1.5 and 1.6.

According to the above arrangement, since the refractive index of the second anti-reflection film 150 is between the refractive index of the transparent light guide structure 130 and the refractive index of the package unit 120, the refractive index is gradually changed when the light passing through the package unit 120, the second anti-reflection film 150 and the transparent light guide structure 130. Therefore, when the light emitted from the light emitting unit 110 arrives at the second anti-reflection film 150 through the package unit 120, possibility of light being totally reflected by an interface F4 between the second anti-reflection film 150 and the package unit 120 is smaller. Similarly, when the light emitted from the light emitting unit 110 arrives at the transparent light guide structure 130 through the second anti-reflection film 150, possibility of light being totally reflected by an interface F5 between the transparent light guide structure 130 and the second anti-reflection film 150 is smaller. Therefore, the second anti-reflection film 150 can reduce occurrence of total internal reflection for light between the transparent light guide structure 130 and the package unit 120, so as to further increase the light extraction efficiency of the light emitting element structure 100'.

Moreover, a thickness of the second anti-reflection film 150 is an odd multiple of $\lambda/4m$, where m is the refractive index of the second anti-reflection film. When partial light emitted from the light emitting unit 110 is totally reflected by the interface F4 between the second anti-reflection film 150 and the package unit 120, and partial light emitted from the light emitting unit 110 is totally reflected by the interface F5 between the transparent light guide structure 130 and the second anti-reflection film 150, the light reflected by the interface F4 between the second anti-reflection film 150 and the package unit 120 has a phase opposite to a phase of the light reflected by the interface F5 between the transparent light guide structure 130 and the second anti-reflection film 150, such that the light reflected by the interface F4 between the second anti-reflection film 150 and the package unit 120 and the light reflected by the interface F5 between the transparent light guide structure 130 and the second anti-reflection film 150 are mutually canceled, so as to further reduce occurrence of total internal reflection in the light emitting element structure 100'.

In contrast to the prior art, the light emitting element structure of the present invention utilizes the transparent light guide structure and the anti-reflection film to reduce occurrence of total internal reflection for light emitted from the light emitting unit, so as to increase light extraction efficiency of the light emitting element structure. Moreover, the transparent light guide structure of the light emitting element structure of the present invention can increase the light divergence angle of the light emitting element structure, in order to further improve illumination efficiency of the light emitting element structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light emitting element structure, comprising:
   a light emitting unit, configured to emit light;
   a package unit, configured to cover the light emitting unit;
   a transparent light guide structure, arranged on the package unit; and
   a first anti-reflection film, arranged on the transparent light guide structure, wherein a thickness of the first anti-reflection film is an odd multiple of $\lambda/4n$, $\lambda$ is a wavelength of light passing through the package unit from the light emitting unit, and n is a refractive index of the first anti-reflection film.

2. The package structure of claim 1, wherein the package unit comprises:
   a package resin; and
   a plurality of wavelength conversion particles distributed in the package resin, for converting a wavelength of light emitted from the light emitting unit.

3. The package structure of claim 2, wherein the plurality of wavelength conversion particles are fluorescent powders.

4. The package structure of claim 2, wherein the plurality of wavelength conversion particles are quantum dots.

5. The package structure of claim 1, wherein the refractive index of the first anti-reflection film is between a refractive index of the transparent light guide structure and a refractive index of air.

6. The package structure of claim 1, wherein the first anti-reflection film is made of magnesium fluoride.

7. The package structure of claim 1 further comprising:
   a second anti-reflection film, arranged between the transparent light guide structure and the package unit, wherein a thickness of the second anti-reflection film is an odd multiple of $\lambda/4m$, m is a refractive index of the second anti-reflection film.

8. The package structure of claim 7, wherein the refractive index of the second anti-reflection film is between a refractive index of the transparent light guide structure and a refractive index of the package unit.

9. The package structure of claim 1, wherein the light emitting unit is a light emitting diode die.

* * * * *